(12) United States Patent
Arvin et al.

(10) Patent No.: US 9,084,378 B2
(45) Date of Patent: Jul. 14, 2015

(54) UNDER BALL METALLURGY (UBM) FOR IMPROVED ELECTROMIGRATION

(71) Applicant: International Business Machines Corporation, Armonk, NY (US)

(72) Inventors: Charles L. Arvin, Poughkeepsie, NY (US); Minhua Lu, Mohegan Lake, NY (US); Eric D. Perfecto, Poughkeepsie, NY (US); Krystyna W. Semkow, Poughquag, NY (US); Thomas A. Wassick, LaGrangeville, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 119 days.

(21) Appl. No.: 13/829,242

(22) Filed: Mar. 14, 2013

(65) Prior Publication Data

US 2014/0262458 A1    Sep. 18, 2014

(51) Int. Cl.
*H01L 21/44* (2006.01)
*H01L 23/48* (2006.01)
(Continued)

(52) U.S. Cl.
CPC .......... *H05K 3/4007* (2013.01); *H01L 23/3192* (2013.01); *H01L 24/05* (2013.01); *H01L 24/13* (2013.01); *H01L 24/03* (2013.01); *H01L 24/11* (2013.01); *H01L 2224/0345* (2013.01); *H01L 2224/03462* (2013.01); *H01L 2224/05022* (2013.01); *H01L 2224/05027* (2013.01); *H01L 2224/0558* (2013.01); *H01L 2224/05147* (2013.01); *H01L 2224/05155* (2013.01);

(Continued)

(58) Field of Classification Search
CPC . H01L 24/05; H01L 2224/0401; H01L 24/16; H01L 2224/05147; H01L 2224/05599; H01L 2224/05155; H01L 2224/05027; H01L 2224/13599; H01L 2224/29599; H01L 2224/13655; H01L 23/3192; H01L 24/83
USPC .................. 257/737, E23.021, E21.508, 738, 257/E21.499, 773, 781, 734, 762, 750, 766, 257/753, E23.001, E23.004, 693, 748; 438/613, 614, 612, 108, 106, 15, 652, 438/687, 64, 51, 669, 584, 26
See application file for complete search history.

(56) References Cited

U.S. PATENT DOCUMENTS 5,466,635 A    11/1995   Lynch et al.
5,759,910 A    6/1998    Mangold et al.
(Continued)

FOREIGN PATENT DOCUMENTS

KR    1154621    12/2012

*Primary Examiner* — Yasser A Abdelaziez
*Assistant Examiner* — Cory Eskridge
(74) *Attorney, Agent, or Firm* — Scully, Scott, Murphy & Presser, P.C.; Parashos T. Kalaitzis, Esq.

(57) ABSTRACT

An interconnect structure that includes a substrate having an electrical component present therein, and a under-bump metallurgy (UBM) stack that is present in contact with a contact pad to the electrical component that is present in the substrate. The UBM stack includes a metallic adhesion layer that is direct contact with the contact pad to the electrical component, a copper (Cu) seed layer that is in direct contact with the metallic adhesion layer, a first nickel (Ni) barrier layer that is present in direct contact with copper (Cu) seed layer, and a layered structure of at least one copper (Cu) conductor layer and at least one second nickel (Ni) barrier layer present on the first nickel (Ni) barrier layer. A solder ball may be present on second nickel (Ni) barrier layer.

16 Claims, 3 Drawing Sheets

(51) Int. Cl.
  *H01L 23/52* (2006.01)
  *H05K 3/40* (2006.01)
  *H01L 23/31* (2006.01)
  *H05K 3/34* (2006.01)
  *H01L 23/00* (2006.01)

(52) U.S. Cl.
  CPC ............... *H01L2224/05572* (2013.01); *H01L 2224/05647* (2013.01); *H01L 2224/11334* (2013.01); *H01L 2224/11849* (2013.01); *H01L 2224/13005* (2013.01); *H01L 2224/13022* (2013.01); *H01L 2224/13111* (2013.01); *H01L 2924/3656* (2013.01); *H05K 3/3463* (2013.01); *H05K 2201/0338* (2013.01); *H05K 2201/09745* (2013.01); *H05K 2203/041* (2013.01)

(56) References Cited

U.S. PATENT DOCUMENTS

| | | | |
|---|---|---|---|
| 5,792,594 | A | 8/1998 | Brown et al. |
| 6,362,090 | B1 | 3/2002 | Paik et al. |
| 8,232,655 | B2 | 7/2012 | Arvin et al. |
| 2008/0169539 | A1* | 7/2008 | Fang et al. .......... 257/676 |
| 2009/0184425 | A1* | 7/2009 | Hu et al. ............. 257/762 |
| 2011/0156256 | A1* | 6/2011 | Kang et al. .......... 257/751 |

* cited by examiner

US 9,084,378 B2

UNDER BALL METALLURGY (UBM) FOR IMPROVED ELECTROMIGRATION

BACKGROUND

The present disclosure generally relates to interconnect structures, and methods of making the same.

The solder bump has a long production history. Solder bump process variations have lowered the manufacturing cost, widened flip chip applicability, and made solder bumped die and wafers available from several suppliers to the commercial market. In some examples, the solder bump flip chip process may be considered as four sequential steps: (1) preparing the wafer for solder bumping, (2) forming or placing the solder bumps, (3) attaching the bumped die to the board, substrate, or carrier, and (4) completing the assembly with an adhesive underfill.

SUMMARY

In one embodiment, the present disclosure provides an interconnect structure including a substrate having an electrical component present therein, and an under-bump metallurgy (UBM) stack that is present in contact with a contact pad to the electrical component. In one embodiment, the UBM stack includes a metallic adhesion layer that is direct contact with the contact pad to the electrical component and a copper (Cu) seed layer that is in direct contact with the metallic adhesion layer. In some embodiments, a first nickel (Ni) barrier layer is present in direct contact with Cu seed layer, and a first Cu conductor layer is present on the first Ni barrier layer. A second Ni barrier layer may be present on the first Cu conductor layer. A solder ball may be present on the second Ni barrier layer.

In another embodiment, the present disclosure provides an interconnect structure that includes a substrate having an electrical component present therein, and an under-bump metallurgy (UBM) stack that is present in contact with the contact pad to the electrical component. The UBM stack includes a metallic adhesion layer that is direct contact with the contact pad to the electrical component, and a Cu seed layer that is in direct contact with the metallic adhesion layer. The UBM stack further includes a barrier layer composed of a metal selected from the group consisting of nickel (Ni), titanium (Ti), cobalt (Co) and combinations thereof. The barrier layer is present in direct contact with the Cu seed layer. A conductor stack including at least one Cu containing conductor layer may be present on the barrier layer. A solder ball is present on the conductor stack.

In another embodiment, the present disclosure provides a method of forming an interconnect structure. In one embodiment, the method may begin with forming a UBM stack on a contact pad to an electrical component that is present in a substrate. Forming the UBM stack may begin with forming a metallic adhesion layer on the contact pad to the electrical component. A Cu seed layer may be formed on the metallic adhesion layer. A first Ni barrier layer may then be formed in direct contact with the Cu seed layer. The first Ni barrier layer protects the Cu seed layer from reacting with the elements of later formed metallic layers. A first Cu conductor layer may then be formed on the first Ni barrier layer, and a second Ni barrier layer may be formed on the first Cu conductor layer. A solder ball may be formed on the second Ni barrier layer.

In yet another aspect, a method is provided for reducing the consumption of Cu seed layers in the UBM stack of an interconnect. In some embodiments, the method may begin with providing a metallic adhesion layer on a contact pad to an electrical component that is present in a substrate. A Cu seed layer may then be formed on the metallic adhesion layer. A Ni barrier layer may be formed directly on the Cu seed layer. A conductor stack including at least one Cu conductor layer is formed on the Ni barrier layer. A solder ball may be formed on the conductor stack. Metallic elements from the solder ball are obstructed from reacting with the Cu seed layer by the Ni barrier layer when a current ranging from 200 milliamps to 1 amp is passed through the UBM stack.

In yet another embodiment, an interconnect structure is provided that includes a substrate having an electrical component present therein. An under-bump metallurgy (UBM) stack that is present in contact with a contact pad to the electrical component that is present in the substrate. The UBM stack includes a metallic adhesion layer that is direct contact with the contact pad to the electrical component, a copper (Cu) seed layer that is in direct contact with the metallic adhesion layer, and a nickel (Ni) barrier layer that is present in direct contact with the copper (Cu) seed layer. A solder ball is in direct contact with the nickel (Ni) barrier layer. In some embodiments, the nickel (Ni) barrier layer includes an alloying element selected from the group consisting of nickel (Ni), titanium (Ti), cobalt (Co) and combinations thereof.

DESCRIPTION OF THE SEVERAL VIEWS OF THE DRAWINGS

The following detailed description, given by way of example and not intended to limit the disclosed structures and methods solely thereto, will best be appreciated in conjunction with the accompanying drawings, wherein like reference numerals denote like elements and parts, in which.

DETAILED DESCRIPTION

Figure 1:
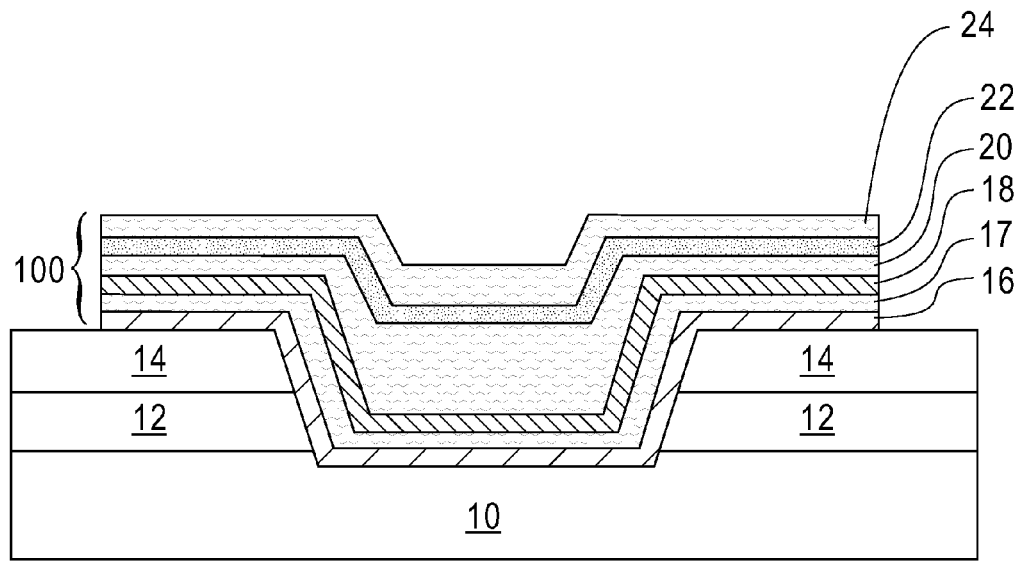
FIG. 1 is a side cross-sectional view of one embodiment of forming a UBM stack on a contact pad to an electrical component that is present in a substrate, in accordance with the present disclosure.

Detailed embodiments of the present disclosure are disclosed herein; however, it is to be understood that the disclosed embodiments are merely illustrative and may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the embodiments of the present disclosure. For purposes of the description hereinafter, the terms "upper", "lower", "vertical", "horizontal", "top", "bottom", and derivatives thereof shall relate to the embodiments of the disclosure, as it is oriented in the drawing figures.

The embodiments of the present disclosure relate to interconnect structures and methods of making the same. Traditionally, solder bumps (also referred to as "solder balls"), such as C4 (controlled collapse chip connection) bumps, have been used to bond a chip to a chip carrier. The term "solder", as used herein, refers to any metal or metallic compound or alloy that is melted and then allowed to cool in order to join two or more metallic surfaces together. Generally speaking, solders have melting temperatures in the range of 150° C. to 300° C. Solder bumps may be small spheres of solder (solder balls) that are bonded to contact areas, interconnect lines or pads of semiconductor devices. In some embodiments, the solder bumps can be made from lead-free solder mixtures or lead tin solder.

Under-bump metallurgy (UBM) (also referred to as "ball limiting metallurgy (BLM)") is a solder wettable terminal metallurgy that defines the size and area of the soldered connection between the solder ball and the component that the solder ball is to be placed in electrical communication with. The UBM limits the flow of the solder ball to the desired area. In some embodiments, the UBM provides adhesion and contact to the chip wiring. In some examples, the UBM may include an adhesive layer, a barrier layer and a conductive layer that provides a path for interconnection between the device back end of line structures, and the electrical structures to be connected to the device back end of the line structures, using a solder bump. The adhesive layer, the barrier layer and the conductive layer provide a path for interconnection between the device and the chip. The adhesive layer can be metals like titanium (Ti) or an alloy of titanium (Ti) and tungsten (W). The barrier layer can be composed of nickel (Ni). The main conductive layer is typically copper (Cu). A typical plated UBM layer may consist of a metal stack including a sputtered Ti and W alloy layer, a sputtered Cu layer, a plated Ni layer and a plated Cu layer. This process includes subtractive etching of the copper seed layer. In this process, some of the top layer of copper can be etched by the wet etch process. When improvements in electromigration are needed, a Cu layer is introduced under the 2 microns of nickel to improve the current distribution and reduce the peak current density. The Cu layer is then plated first to a thickness of 10 microns, followed by a Ni layer of 2 microns, and a top Cu layer. One of the limitations of this structure is that under severe electromigration testing, the full copper thickness can be consumed, resulting in a failure via a high resistance or electrical open. A potential solution is to increase the thickness of the Cu pillar to be greater than 20 microns. In this manner, the solder is 100% reacted prior to hitting the interface at the bottom of the under-bump metallurgy. A Cu pillar system at these thicknesses results in a very stiff interconnect, which can produce white bumps at fabrication during traditional tack and reflow processes.

In some embodiments, the methods and structures disclosed herein introduce a Ni barrier layer as the bottom layer of the UBM stack. By introducing a Ni barrier layer in place of a layer that is typically composed of Cu, a stronger barrier is provided that is resistant to electromigration. More specifically, Ni has a lower reaction rate than Cu, which creates a strong barrier once the Cu pedestal has been consumed and transformed to an intermetallic including tin (Sn) from the solder ball.

FIG. 1 depicts one embodiment of forming a UBM stack in contact with a contact pad to an electrical component that is present in (or on) a substrate. In particular, the embodiment shown in FIG. 1 includes an aluminum layer 10, a passivation layer 12 and a polyimide layer 14. The aluminum layer 10 provides one example of a line to an electrical component that may be present in/or on a substrate (not shown). In some embodiments, the aluminum layer 10 may be in electrical communication with line structures, vias, semiconductor devices, memory devices, diodes, capacitors, and other electrical devices that may be present in the substrate. In one embodiment, the base material of the substrate may be any material that provides a semiconductor wafer, such as, silicon (Si), strained Si, silicon doped with carbon (Si:C), silicon germanium (SiGe), silicon germanium doped with carbon (SiGe:C), Si alloys, germanium (Ge), Ge alloys, gallium arsenic (GaAs), indium arsenic (InAs), and indium phosphorus (InP), as well as other III/V and II/VI compound semiconductors. In another embodiment, the substrate may be a ceramic material.

The aluminum layer 10 is only one example of a metallurgical composition for the electrical component that the UBM stack 100 may be contact with. For example, instead of being composed of aluminum, the conductive feature that is identified by reference number 10 may be composed of other metals, such as tungsten (W), platinum (Pt), copper (Cu), silver (Ag), or may be composed of electrically conductive doped semiconductor materials. The aluminum layer 10 may be a deposited layer that is formed by processes such as electroplating or sputtering.

Still referring to FIG. 1, a passivation layer 12 may be present on the aluminum layer 10. The passivation layer 12 may be composed of an oxide, nitride or oxynitride dielectric. In some examples, when the passivation layer 12 is composed of an oxide, the passivation layer 12 may be composed of silicon oxide ($SiO_2$ or hafnium oxide ($HfO_2$). In some other examples, when the passivation layer 12 is composed of a nitride, the passivation layer 12 may be composed of silicon nitride ($Si_3N_4$). In some other examples, when the passivation layer 12 is composed of an oxynitride, the passivation layer 12 may be composed of silicon oxynitride. The passivation layer 12 may be formed by a deposition process, such as spinning from solution, spraying from solution, chemical vapor deposition (CVD), plasma enhanced CVD (PECVD), evaporation and combinations thereof.

In some embodiments, the polyimide layer 14 is an organic passivation layer that is present on the passivation layer 12. In one example, the organic passivation layer that provides the polyimide layer 14 is benzo-cyclobutene (BCB). In another example, the organic passivation layer that provides the polyimide layer 14 is a photosensitive polyimide. It is noted that other materials may also be suitable for use in the polyimide layer 14, which can have useful mechanical properties that make them suitable as stress buffer passivation layers to improve device reliability by eliminating stresses introduced during packaging operations. The polyimide layer 14 may be formed by a deposition process, such as spinning from solution, spraying from solution, chemical vapor deposition (CVD), plasma enhanced CVD (PECVD), evaporation and combinations thereof. In some embodiments, the polyimide layer 14 may have a thickness ranging from 5 microns to 15 microns. In one example, the polyimide layer 14 has a thickness of 7 microns. In another example, the thickness of the polyimide layer 14 may range from 12 microns to 20 microns when acting as a stress buffer passivation layer.

Those of skill in the art will understand that the layers identified by reference numbers 10, 12, and 14 can include other combinations of material layers. As such, the present disclosure should not be limited to the only the materials and combinations depicted for the exemplary layers that are illustrated in FIG. 1.

Still referring to FIG. 1, and in some embodiments, a trench is formed through the passivation layer 12 and a polyimide layer 14 to expose a portion of the aluminum layer 10 using lithography and etching processes. For example, an etch mask, such as a photoresist mask, may be applied over the portions of the polyimide layer 14 and the passivation layer 12 that are to be removed to form the trench and expose the portion of the aluminum layer 10 that is to be contacted by the later formed under-bump metallurgy (UBM) stack. More specifically, a patterned etch mask is produced on the polyimide layer 14 by applying a photoresist to the surface to be etched, exposing the photoresist to a pattern of radiation, and then developing the pattern into the photoresist utilizing a resist developer. Once the patterning of the photoresist is completed, the sections covered by the etch mask composed of the photoresist are protected, while the underlying structures exposed by the opening in the etch mask are removed using a selective etching process. As used herein, the term "selective" in reference to a material removal process denotes that the rate of material removal for a first material is greater than the rate of removal for at least another material of the structure to which the material removal process is being applied. For example, a first material may be removed with a selectivity of greater than 100:1 to a second material. The etch process for forming the trench may also be anisotropic. As used herein, an "anisotropic etch process" denotes a material removal process in which the etch rate in the direction normal to the surface to be etched is much higher than in the direction parallel to the surface to be etched. Examples of anisotropic etch process suitable for forming the trench include, but are not limited to, reactive-ion etching (RIE), ion beam etching, plasma etching and/or laser ablation. Reactive ion etch (RIE) is a form of plasma etching, in which the surface to be etched may be placed on an RF powered electrode and takes on a potential that accelerates an etching species, which is extracted from a plasma, towards the surface to be etched, wherein a chemical etching reaction takes place in the direction normal to the surface being etched. In one embodiment, the etch process removes the exposed portions of the polyimide layer 14, and the exposed portions of the passivation layer 12 selectively to the etch mask. In some embodiments, a portion of the aluminum layer 10 may be removed by the etch process, but the etch process is terminated before substantially etching through the aluminum layer 10. In some embodiments, end point detection is employed to determine when the etch process for forming the trench has exposed the aluminum layer 10.

The trench to the aluminum layer 10 typically dictates the dimensions of the contact pad to the electrical component that is present in the substrate. In some embodiments, the trench that is formed through the polyimide layer 14 and the passivation layer 12 has a width (e.g., diameter) ranging from 10 microns to 100 microns. In another embodiment, the trench that is formed through the polyimide layer 14 and the passivation layer 12 has a width ranging from 25 microns to 75 microns. In one example, the trench has a width on the order of 50 microns. The aspect ratio of height to opening width of the trench is typically about 1:1, e.g. within the range of 0.75:1 to 1.5:1. In one example, the aspect ratio (thickness to opening) for filling the trench can be 0.5:1. The opening provided by the trench to the aluminum layer 10 may be dependent upon the solder bump (C4) size being plated and, in some embodiments, may be reduced to a width of about 25 microns or 10 microns for some advanced applications. It is noted that the above dimension are provided for illustrative purposes only and are not intended to limit the present disclosure, as other dimensions have been contemplated and are equally applicable to the methods and structures disclosed herein.

Still referring to FIG. 1, the trench is filled with several different layers that form a under-bump metallurgy (UBM) stack 100 on the contact pad to the electrical component that is present within the substrate. The multiple layers of the UBM stack 100 may be formed using sputtering and plating techniques. In one embodiment, the UBM stack 100 includes a metallic adhesion layer 16, e.g., titanium tungsten (TiW) layer, that is direct contact with the contact pad to the electrical component, and a copper (Cu) seed layer 17 that is in direct contact with the metallic adhesion layer 16. The term "direct contact" means that a first element, such as a first structure, and a second element, such as a second structure, are connected without any intermediary conducting, insulating or semiconductor layers at the interface of the two elements. The terms "on" and "positioned on" means that a first element, such as a first structure, is present on a second element, such as a second structure, wherein intervening elements, such as an interface structure, e.g. interface layer, may be present between the first element and the second element. The UBM stack 100 further includes a first nickel (Ni) barrier layer 18 that is present in direct contact with the Cu seed layer 17, a first copper (Cu) conductor layer 20 present in direct contact with the first Ni barrier layer 18, and a second nickel (Ni) barrier layer 22 present on the first copper conductor layer 20. In some embodiments, the UBM stack 100 may further include a second copper (Cu) conductor layer 24 that is present on the second nickel (Ni) barrier layer 22.

In some embodiments, the metallic adhesion layer 16 is formed in direct contact with the contact pad to the electrical component that is present on or within the substrate. The metallic adhesion layer 16 may be composed of titanium-tungsten (TiW) alloy, a chrome-copper (Cr—Cu) alloy or another alloy having adhesion properties that includes at least one of tantalum (Ta), chrome (Cr), copper (Cu), titanium (Ti) or tungsten (W). In the example that is depicted in FIG. 1, the metallic adhesion layer 16 is composed of a titanium tungsten (TiW) alloy layer that is in direct contact with the portion of the aluminum layer 10 that is exposed by the trench. In one embodiment, the titanium tungsten (TiW) layer is composed of 5 at. % to 50 at. % titanium (Ti) and 95 at. % to 50 at. % tungsten (W).

The metallic adhesion layer 16 is typically deposited using a physical vapor deposition method, such as sputtering. As used herein, "sputtering" means a method of depositing a film of material on a semiconductor surface. A target of the desired material, i.e., source, is bombarded with particles, e.g., ions, which knock atoms from the target, and the dislodged target material deposits on the deposition surface. Examples of sputtering techniques suitable for depositing the metallic adhesion layer 16, but are not limited too, DC diode sputtering ("also referred to as DC sputtering"), radio frequency (RF) sputtering, magnetron sputtering, and ionized metal plasma (IMP) sputtering. In one embodiment, the metallic adhesion layer 16 has a thickness ranging from 1000 Å to 5000 Å. In another embodiment, the metallic adhesion layer 16 has a thickness ranging from 1250 Å to 4500 Å. In yet another embodiment, the metallic adhesion layer 16 has a thickness ranging from 2000 Å to 4000 Å.

The Cu seed layer 17 may be formed in direct contact with the metallic adhesion layer 16. The Cu seed layer 17 may be composed of 95 at. % or greater Cu. In one example, the Cu seed layer 17 is 97 at. % or greater Cu. In yet another example, the Cu seed layer 17 is composed of 100 at. % Cu. The Cu seed layer 17 is typically deposited using a physical vapor deposition (PVD) method, such as sputtering. Examples of sputtering techniques suitable for depositing the Cu seed layer 17 include, but are not limited too, DC diode sputtering ("also referred to as DC sputtering"), radio frequency (RF) sputtering, magnetron sputtering, and ionized metal plasma (IMP) sputtering. The Cu seed layer 17 may have a thickness ranging from 1500 Å to 5000 Å. In another embodiment, the Cu seed layer 17 has a thickness ranging from 2000 Å to 4500 Å. In one example, the Cu seed layer 17 has a thickness ranging from 2000 Å to 4000 Å.

The first Ni barrier layer 18 is in direct contact with the Cu seed layer 17. The composition of the first Ni barrier layer 18 is selected to have a slower reaction rate than the reaction rate of Cu in order to provide a barrier layer to the Cu seed layer 17. More specifically, the first Ni barrier layer 18 protects the Cu seed layer 17 from being consumed by interaction with elements that diffuse towards the Cu seed layer 17 from the later formed solder bump as the result of electromigration in high current applications. Electromigration of silver (Ag) and tin (Sn) elements from the solder bump can form an intermetallic material with copper (Cu), such as copper tin (Cu—Sn) intermetallics and copper nickel tin (Cu—Ni—Sn) intermetallics. The interaction between copper (Cu) and tin (Sn) in forming intermetallics, such as $Cu_3Sn$, can result in the formation of voids, e.g., Kirkendall voids. If the electromigration of the metallic elements, such as tin (Sn), reach the Cu seed layer 17, intermetallics are formed proximate to the interface between the UBM stack 100 and the contact pad to the electrical component that is present within the substrate. This can impact the electrical and magnetic properties of the UBM stack 100. For example, the adhesion properties of the UBM stack 100 can be reduced to the point of failure by intermetallics and voids formed at the Cu seed layer 17. In some embodiments, by providing a bather material, e.g., first Ni barrier layer 18, on the Cu seed layer 17 having a reaction rate with tin (Sn) and silver (Ag) that is slower than the reaction rate of copper (Cu) with tin (Sn) and silver (Ag), the methods and structures disclosed herein reduce or eliminate the incidence of intermetallics and voids at the Cu seed layer 17 that are typically produced by electromigration effects. The first Ni barrier layer 18 also provides a reduction in thermal undercut during reflow, and the first Ni barrier layer 18 also enhances current spreading.

In one embodiment, the first Ni barrier layer 18 is composed of 50 at. % to 100 at. % nickel (Ni). In another embodiment, the first Ni barrier layer 18 is composed of greater than 99 at. % nickel (Ni). In one example, the first Ni barrier layer 18 is 100 at. % nickel (Ni). In some embodiments, the first Ni barrier layer 18 comprises an alloy of nickel (Ni) and at least one alloying element selected from the group consisting of cobalt (Co), iron (Fe), titanium (Ti) or a combination thereof. In some embodiments, the alloying additive, i.e., cobalt (Co), iron (Fe) or titanium (Ti), may be present in the first Ni barrier layer 18 in a concentration ranging from 5 at. % to 50 at. %. It is noted that the above compositions for the first Ni barrier layer 18 are provided for illustrative purposes only, and are not intended to limit the present disclosure. For example, any composition may be suitable for the first Ni barrier layer 18, so long as the composition has a lesser reaction rate with the metallic elements of the later formed solder ball than the reaction rate of copper with the metallic elements of the later formed solder ball.

In other examples of the present disclosure, another metallic element may be substituted for the first Ni barrier layer 18, so long as the composition of the metallic element substituted for the nickel (Ni) has a reaction rate with tin (Sn) that is less than the reaction rate of copper (Cu) with tin (Sn), and therefore can provide a barrier layer to electromigration elements from the later formed solder ball 30. For example, elements that can provide a barrier layer to electromigration elements may be selected from the group consisting of titanium (Ti), cobalt (Co) and combinations thereof, and combinations of the aforementioned materials with nickel (Ni).

The barrier layer to electromigration elements is typically formed using a plating process, such as electroplating or electroless plating. Electroplating is a process that uses electrical current to control the flow of charged particles, such as metal cations and anions, so that they form a coherent metal coating on an electrode, which may provide the deposition surface. One example of a plating bath for forming the first Ni barrier layer 18 may include nickel sulfate ($NiSO_4.6H_2O$), nickel chloride ($NiCl_2.6H_2O$) and boric acid ($B(OH)_3$). Another example of a plating bath for forming the first nickel (Ni) barrier layer 18 includes nickel sulfamate ($Ni(SO_3N_2)_2$), nickel chloride ($NiCl_2.6H_2O$) and boric acid ($B(OH)_3$). A further example of a plating bath for forming the first nickel (Ni) barrier layer 18 includes nickel chloride ($NiCl_2.6H_2O$) and boric acid ($B(OH)_3$). Another example of a plating bath for forming the first nickel (Ni) barrier layer 18 may include nickel sulfate ($NiSO_4.6H_2O$) and boric acid ($B(OH)_3$). In yet a further example, the plating bath for forming the first nickel (Ni) barrier layer 18 may include nickel sulfate ($NiSO_4.6H_2O$), ammonium chloride ($NH_4Cl$) and boric acid ($B(OH)_3$).

In another embodiment, the first Ni barrier layer 18 may be formed using electroless plating. Electroless plating of nickel is an auto-catalytic chemical technique used to deposit a layer of nickel-phosphorus or nickel-boron alloy on a solid workpiece, such as the Cu seed layer 17. In some embodiments, the process relies on the presence of a reducing agent, for example hydrated sodium hypophosphite ($NaPO_2H_2.H_2O$) which reacts with the nickel (Ni) metal ions to deposit the metal.

It is noted that the above description of the plating processes for forming the first Ni barrier layer 18 are provided for illustrative purposes only, and are not intended to limit the present disclosure. Other deposition processes may be suitable for forming the first Ni barrier layer 18. For example, the first nickel Ni barrier layer 18 may be formed using sputtering.

In one embodiment, the thickness of the first Ni barrier layer 18 may be the entire thickness of the UBM stack 100. In another embodiment, the first Ni barrier layer 18 has a thickness ranging from 0.5 microns to 50 microns. In yet another embodiment, the first Ni barrier layer 18 has a thickness ranging from 0 microns to 5 microns. In a further embodiment, the first Ni barrier layer 18 has a thickness ranging from 0.5 microns to 2 microns. In one example, the first Ni barrier layer 18 has a thickness of 1.5 microns. In some embodiments, the low thickness of the first Ni barrier layer 18 contributes to providing a thinner UBM stack 100 having less internal stress when compared to prior UBM stacks having a copper (Cu) conductor layer directly formed on a Cu seed layer 17. In one example, the thickness of the first Ni barrier layer 18 is selected to be no greater than ⅓ an entire thickness of the UBM stack 100. In some embodiments, the high thickness of the first Ni barrier layer 18 contributes to providing a uniform current distribution even after the first Cu conducting layer is consumed due to electromigration.

A first Cu conductor layer 20 is present in direct contact with the first Ni barrier layer 18. The first Cu conductor layer 20 may be composed of 95 at. % or greater copper (Cu). In one example, the first Cu conductor layer 20 is 99 at. % or greater copper (Cu). In yet another example, the first Cu conductor layer 20 is composed of 100 at. % copper (Cu). It is noted that the above compositions for the first Cu conductor layer 20 are provided for illustrative purposes only, and are not intended to limit the present disclosure.

In one embodiment, the first Cu conductor layer 20 is plated on the first Ni barrier layer 18. For example, the first Cu conductor layer 20 may be deposited using electroplating or electroless plating. One example of a plating bath composition that is suitable for electroplating the first Cu conductor layer 20 may include a copper sulfate ($CuSO_4$) solution with sulfuric acid ($H_2SO_4$). In some embodiments, electroless deposition of copper (Cu) may rely on the presence of a reducing agent, for example formaldehyde (HCHO), which reacts with the copper (Cu) metal ions to deposit the metal. In an even further embodiment, the first Cu conductor layer 20 may be deposited using a sputter process. In some embodiments, the first Cu conductor layer 20 has a thickness ranging from 0.25 microns to 15 microns. In another embodiment, the first Cu conductor layer 20 has a thickness ranging from 5 microns to 10 microns. In one embodiment, the first Cu conductor layer 20 may be omitted.

Still referring to FIG. 1, and in one embodiment, a second nickel (Ni) barrier layer 22 may be formed on the first Cu conductor layer 20. The second Ni barrier layer 22 may have a composition that is similar to the first Ni barrier layer 18. For example, the second Ni barrier layer 22 may be deposited having a composition of greater than 95 at. % nickel. In some embodiments, the second nickel (Ni) barrier layer 22 can also utilize electrolytic nickel (Ni), e.g., nickel cobalt (NiCo), as well as nickel (Ni) alloy plating. From a perspective of a barrier layer, nickel (Ni) or a nickel (Ni) alloy would also be a valid selection. The above description of the first Ni barrier layer 18 is also suitable for the description of the second Ni barrier layer 22. Similar to the first Ni barrier layer 18, the second Ni barrier layer 22 may be deposited using plating, such as electroplating or electroless plating, or sputtering. The second Ni barrier layer 22 can have a thickness as great as 10 microns. In another embodiment, the second Ni barrier layer 22 may have a thickness ranging from 0.25 microns to 5 microns. In yet another embodiment, the second Ni barrier layer 22 may have a thickness ranging from 1 microns to 5 microns. The second Ni barrier layer 22 can prevent consumption (e.g., undercutting) of the underlying copper layers, e.g., the first Cu conductor layer 20, thereby preventing electromigration effects from occurring to the device.

The second Ni barrier layer 22 may be positioned within the UBM stack 100 to limit the amount of copper (Cu) that is available to react with the tin (Sn) from the later formed solder ball 30. In some embodiments, the second Ni barrier layer 22 preserves the UBM stack 100 by preventing excess copper (Cu) from forming intermetallic compounds, such as $Cu_3Sn$, and by preventing the formation of Kirdendall voids. The second Ni barrier layer 22 may also be positioned proximate to the middle of the UBM stack 100 to preserve the thickness of the UBM stack 100, while reducing the amount of copper (Cu) that is present in the UBM stack 100.

In some embodiments, a second copper (Cu) conductor layer 24 is present on the second Ni barrier layer 22. The second Cu conductor layer 24 may have a composition that is similar to the first Cu conductor layer 20. Therefore, the above description of the composition of the first Cu conductor layer 20 is suitable for the description of the second Cu conductor layer 24. The second Cu conductor layer 24 may be plated onto the second Ni bather layer 22. For example, the second Cu conductor layer 24 may be plated using electroplating or electroless deposition. In other embodiments, the second Cu conductor layer 24 may be formed using sputtering. In one embodiment, the second Cu conductor layer 24 may have a thickness that is as great as 10 microns. In another example, the second Cu conductor layer 24 may have a thickness ranging from 0.25 microns to 3 microns. In yet another example, the second Cu conductor layer 24 may have a thickness that ranges from 0.5 microns to 1.5 microns.

Figure 2:
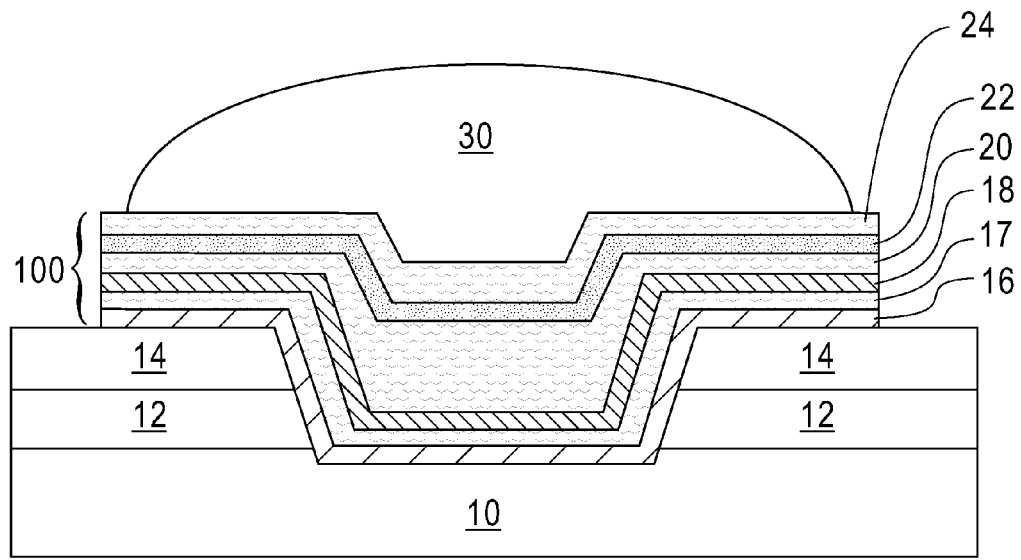
FIG. 2 is a side cross-sectional view of one embodiment of forming a solder ball on the UBM stack that is depicted in FIG. 1, in accordance with the present disclosure.

Following formation of second Cu conductor layer 24, a solder ball 30 may be applied to the UBM stack 100. FIG. 2 depicts one embodiment of forming a solder ball 30 (prior to reflow) on the under-bump metallurgy (UBM) stack 100 that is depicted in FIG. 1. When reflowed at high temperature, e.g., 240° C. to 260° C., the solder ball 30 and a portion of the UBM stack 100 reflow to form an electrical and mechanical connection with the contact pad to the electrical component that is present in the substrate. In some embodiments, an oxidation barrier, i.e., a layer resistant to oxidation, may be formed between the UBM stack 100 and the solder ball 30.

In some embodiments, prior to the application of the solder ball 30, the UBM stack 100 may be lithographically patterned, for example, by applying, exposing, and developing a photoresist (not shown) to form a pattern, followed by an etch that patterns the UBM stack 100 to form a pad structure for the solder ball 30. Following etching, the photoresist may then removed.

A solder ball 30 may thereafter be applied to the UBM stack 100. In some embodiments, the solder ball 30 may comprise a lead-free solder. In this case, the solder ball 30 may comprise a tin copper (Sn—Cu) alloy, a tin silver (Sn—Ag) alloy, or a tin copper silver (Sn—Cu—Ag) alloy.

When copper (Cu) is present in the alloy that provides the solder ball 30, the copper (Cu) may be present in an amount ranging from 0.1 at. % to 2 at. %. In one embodiment, the copper (Cu) content within the solder ball 30 may range from 0.1 at. % to 1 at. %. In another embodiments, the concentration of copper (Cu) that is present in the solder ball is about 0.7 at. %. When silver (Ag) is present in the alloy that provides the solder ball 30, the concentration of silver is from about 0.5 at. %. to about 3.5 at. %. In one embodiment, the silver content in the solder ball 30 may range from 0.1 at. % to 3 at. %. In a solder ball 30 including the above concentration of silver (Ag) and copper (Cu), the remainder of the solder ball 30 may be tin (Sn). In some other embodiments, the solder ball may comprise a lead-based solder. The diameter of the solder ball 30, as measured in the largest horizontal cross-section of the solder ball 30, may be from about 25 µm to about 150 µm. In another embodiment, the diameter of the solder ball 30 may rang from 50 µm to about 125 µm.

Optionally, the solder ball 30 may then be "reflowed" to enhance adhesion to the UBM stack 100. The reflow of the solder ball 30 is facilitated by subjecting the solder ball 30 and the UBM stack 100 to an anneal at an elevated temperature. For example, the solder ball 30 and the UBM stack 100 are annealed at a temperature ranging from 210° C. to 260° C. In another example, the solder ball 30 and the UBM stack 100 are annealed at temperature from 220° C. to 250° C. The duration of the anneal at the elevated temperature for the reflow process may range from 5 minutes to 24 hours. In another example, the anneal at the elevated temperature for the reflow process may range from 10 minutes to 1 hour.

During the reflow, a portion of the UBM stack 100 reacts with the material of the solder ball 30. This may result in the formation of an intermetallic alloy, such as tin copper (Sn—Cu) alloy, a nickel-tin (Ni—Sn) alloy, a tin-silver (Sn—Ag) alloy, a copper-nickel-tin (Cu—Ni—Sn) alloy, a copper-silver (Cu—Ag) alloy, a copper-nickel-silver (Cu—Ni—Ag) alloy or a tin-copper-silver (Sn—Cu—Ag) alloy, a nickel-tin-silver (Ni—Sn—Ag) alloy, a nickel-silver (Ni—Ag) alloy, a nickel-copper-tin-silver (Ni—Cu—Sn—Ag) alloy or a combination thereof. The portion of the solder ball 30 and the UBM stack 100 that interdiffuse to provide the intermetallic alloy is at the interface between the solder ball 30 and the UBM stack 100, in which at least a portion of the solder ball 30 and the UBM stack 100 are consumed by the intermetallic alloy.

In some examples, during the reflow of the solder ball 30, a stable intermetallic composition may be formed with the nickel (Ni) of the second Ni barrier layer 22, such as, for example, a nickel tin (NiSn) alloy. This is due to a phase transformation. Thus, the presence of the second Ni barrier layer 22 directly on the first Cu conductor layer 20 preserves the underlying copper (Cu).

The first Ni barrier layer 18 protects the Cu seed layer 17 from the electromigration of elements, such as tin (Sn) and silver (Ag), from the solder ball 30 from reaching the Cu seed layer 17. For example, in the embodiments in which the first Cu conductor layer 20 is completely consumed by intermetallics produced by electromigration of metal elements from the solder ball 30, further electromigration of these elements is obstructed from reaching the Cu seed layer 17 by the first Ni barrier layer 18. Examples of intermetallics that may be formed with the first Cu conductor layer 20 include tin copper (Sn—Cu) alloy, a nickel-tin (Ni—Sn) alloy, a tin-silver (Sn—Ag) alloy, a copper-nickel-tin (Cu—Ni—Sn) alloy, a copper-silver (Cu—Ag) alloy, a copper-nickel-silver (Cu—Ni—Ag) alloy or a tin-copper-silver (Sn—Cu—Ag) alloy, a nickel-tin-silver (Ni—Sn—Ag) alloy, a nickel-silver (Ni—Ag) alloy, a nickel-copper-tin-silver (Ni—Cu—Sn—Ag) alloy and combination thereof. In some embodiments, tin (Sn) may react with the first Ni barrier layer 18 to provide a surface of a stable intermetallic composition of a nickel tin (NiSn) alloy. The reactivity of the nickel (Ni) within the first Ni barrier layer 18 is less than the reactivity of copper (Cu). Therefore, in some embodiments, the low reactivity of the nickel (Ni) within the first Ni barrier layer 18 keeps elements that have electromigrated from the solder ball 30 from reaching the Cu seed layer 17. By obstructing the metal elements from the solder ball 30 from reaching the Cu seed layer 17, the methods and structures disclosed herein can reduce, if not eliminate, the formation of tin (Sn) and copper (Cu) containing intermetallics, as well as voids, such as Kirkendall voids, from forming proximate to the interface between the contact pad to the electrical component that is present on the substrate and the metallic adhesion layer 16, e.g., TiW layer, of the UBM stack 100.

In some prior structure, in which the first Ni barrier layer 18 is not present, the formation of the aforementioned intermetallics and voids in such close proximity to the interface between the UBM stack 100 and the contact pad to the electrical component that is present on the substrate, reduces the electrical properties and mechanical performance of the interconnect. For example, the formation of intermetallics and voids at the Cu seed layer 17 can increase the resistance of the resistance of the interconnect, and the formation of intermetallics and voids at the Cu seed layer 17 can decrease adhesion of the UBM stack 100 and the solder ball 30 to the contact pad to the electrical component that is present on the substrate.

Therefore, by reducing, and in some instances eliminating, the incidence of intermetallics proximate to the interface between the UBM stack 100 and the contact pad to the electrical component that is present on the substrate, e.g., at the Cu seed layer 17, the methods and structures disclosed herein provide a UBM stack 100 having increased mechanical performance, i.e., increased adhesion, and increased electrical performance, i.e., lower resistance, when compared to prior UBM stacks that do not include at least one of the first Ni barrier layer 18 in direct contact with a Cu seed layer 17, as well as the second Ni barrier layer 22.

In some embodiments, the UBM stack 100 that is described above with reference to FIGS. 1 and 2 can be particularly suitable for reducing the consumption of copper (Cu) seed layers when the interconnect including the solder ball 30 and the UBM stack 100 is subjected to a high current application, such as currents ranging from 200 milliamps to 1 amp. In one embodiment, the method for reducing the consumption of the Cu seed layer 17 in a UBM stack 100 of an interconnect may include providing a layered structure including a Cu seed layer 17 and a metallic adhesion layer 16, e.g., TiW alloy layer, on a contact pad to an electrical component that is present on a substrate. A nickel (Ni) barrier layer, i.e., first Ni barrier layer 18, may then be formed directly on the Cu seed layer 17. The first Ni barrier layer 18 has been described above with reference to FIGS. 1 and 2. At least one copper (Cu) containing conductor layer may be formed on the on the Ni barrier layer. The at least one copper (Cu) containing layer may be provided by one of the first and second copper (Cu) conductor layers 20, 24 that have been described above. In some embodiments, the above described second Ni barrier layer 22 may be present between the first and second Cu conductor layers 20, 24. In some embodiments, the thickness of the Ni barrier layer, i.e., first Ni barrier layer, may be no greater than ⅓ an entire thickness of the UBM stack 100 including the metallic adhesion layer 16, e.g., TiW alloy layer, the Cu seed layer 17, the Ni barrier layer, i.e., first Ni barrier layer 18, and the stack including at least one Cu containing layer, e.g., first Cu conductor layer 20, second Ni barrier layer 22, and second Cu conductor layer 24.

The solder ball 30 is then formed on the at least one Cu containing conductor layer. In one embodiment, when a current is passed through at least the UBM stack 100 that ranges from 200 milliamps to 1 amp, metallic elements from the solder ball 30 are obstructed from reacting with the Cu seed layer 17 by the Ni barrier layer, e.g., first Ni barrier layer 18. In some examples, the Ni barrier layer, i.e., first Ni barrier layer 18, obstructs metallic elements from the solder ball 30 from reacting with the Cu seed layer 17 while a current of 250 milliamps to 350 milliamps is passed through the UBM stack 100.

The UBM stack 100 and methods disclosed herein provide a low thickness with a first Ni barrier layer 18 having a low reaction rate with tin (Sn) that enables a less stressful UBM stack 100 for use in high volume solder applications. Further, when the layer that is in direct contact with the Cu seed layer 17 is a nickel (Ni) containing layer, such as the first Ni barrier layer 18, the thermal undercut during reflow and other thermal excursions is reduced. The Ni barrier layer, i.e., first Ni barrier layer 18, that is in contact with the Cu seed layer 17 may also enhance current spreading in the UBM stack 100. In some embodiments, the Ni barrier layer, such the first Ni barrier layer 18 and the second Ni barrier layer 22, may be vertically shifted within the UBM stack 100 allowing for control of the degree of copper-tin (Cu—Sn) intermetallic formation and copper-nickel-tin (Cu—Ni—Sn) intermetallic formation within the UBM stack 100, which can reduce the level of Kirkendall void formation by reducing the presence of $Cu_3Sn$ layers.

In another embodiment, an interconnect structure is provided that includes a substrate having an electrical component present therein. An under-bump metallurgy (UBM) stack is present in contact with a contact pad to the electrical component that is present in the substrate. The UBM stack includes a metallic adhesion layer, e.g., TiW adhesion layer, that is direct contact with the contact pad to the electrical component, a copper (Cu) seed layer that is in direct contact with the metallic adhesion layer, and a nickel (Ni) barrier layer that is present in direct contact with the copper (Cu) seed layer. A solder ball is in direct contact with the nickel (Ni) barrier layer. This embodiment is similar to the embodiments depicted in FIG. 2, with the exception that layers 24, 22, and 20 are omitted, and the solder ball 30 is in direct contact with the nickel (Ni) barrier layer 18. In some embodiments, the nickel (Ni) barrier layer includes an alloying element selected from the group consisting of nickel (Ni), titanium (Ti), cobalt (Co) and combinations thereof. In some embodiments, the alloying additive, i.e., cobalt (Co), iron (Fe) or titanium (Ti), may be present in the Ni barrier layer in a concentration ranging from 5 at. % to 50 at. %. It is noted that the above compositions for the Ni barrier layer are provided for illustrative purposes only, and are not intended to limit the present disclosure.

The following examples are provided to further illustrate some aspects of the structures and methods disclosed herein. It is not intended that the present disclosure be limited to the specific examples disclosed.

EXAMPLES

FIGS. 3A-4B are optical cross-sections of interconnects subjected to an electromigration test. The interconnect that provided the optical cross sections depicted in FIGS. 3A-4B were subjected to a current ranging from 250 milliamps to 800 milliamps.

Figure 3A:
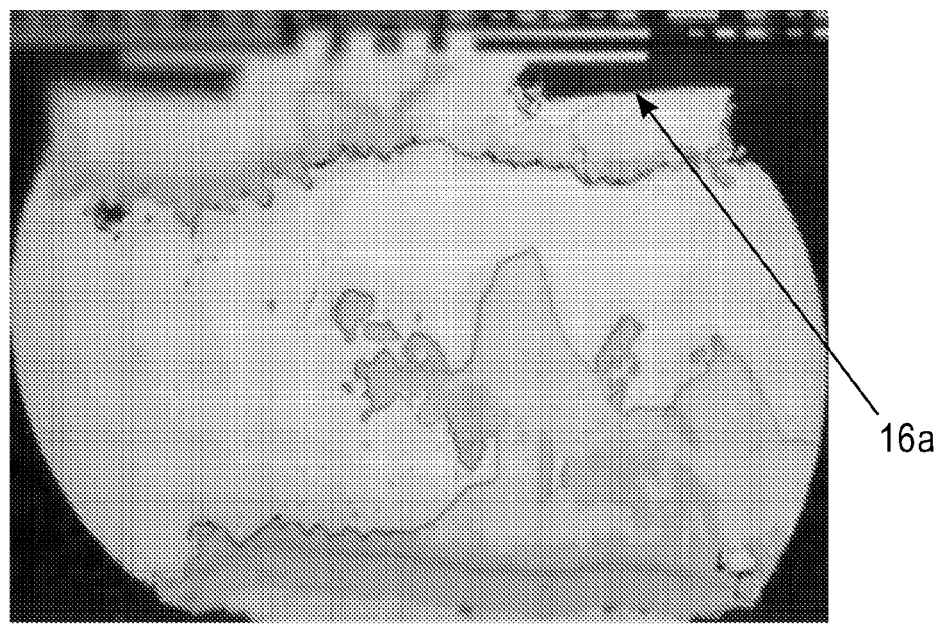
FIG. 3A is an optical cross-section of an interconnect including a UBM stack of a TiW layer, a Cu seed layer, a Cu conductor layer, a Ni barrier layer and a solder ball after an electromigration test.
Figure 3B:
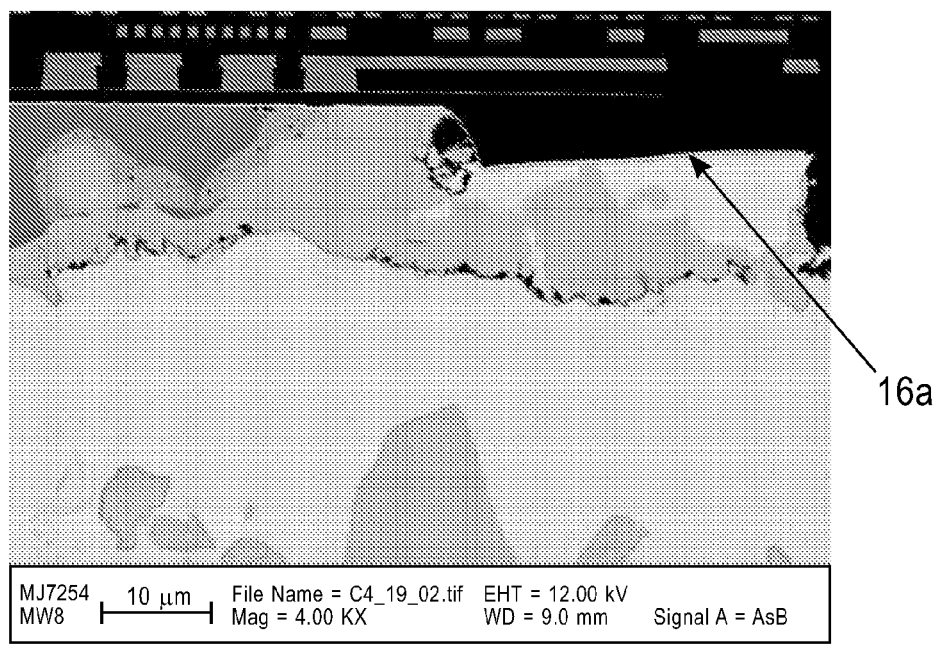
FIG. 3B is a magnified optical view of the interface between the UBM stack and the substrate of the interconnect depicted in FIG. 3A.

FIGS. 3A and 3B depict the optical cross section of an interconnect including a UBM stack of a titanium tungsten (TiW) layer 16a, a copper (Cu) seed layer, and a copper (Cu) conductor layer having a thickness of 9 microns that is in direct contact with the copper (Cu) seed layer. The interconnect further included a nickel (Ni) barrier layer having a thickness of 2 microns in direct contact with the Cu conductor and a solder ball. Following application of the current, the entirety of the Ni barrier layer was consumed by intermetallic formation, and the intermetallics extended to the Cu seed layer. Voids were formed at the copper seed layer. The optical cross sections depicted in FIGS. 3A-3B are a comparative example.

Figure 4A:
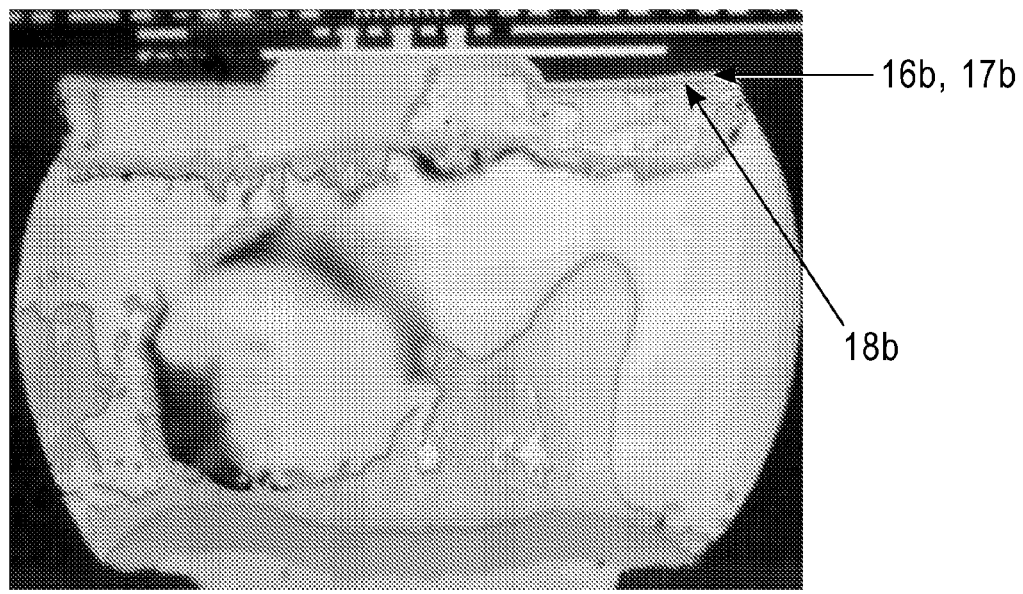
FIG. 4A is an optical cross-section of an interconnect including a UBM stack of a TiW layer, a Cu seed layer, a first Ni barrier layer, a Cu conductor layer, a second Ni barrier layer and a solder ball after an electromigration test.
Figure 4B:
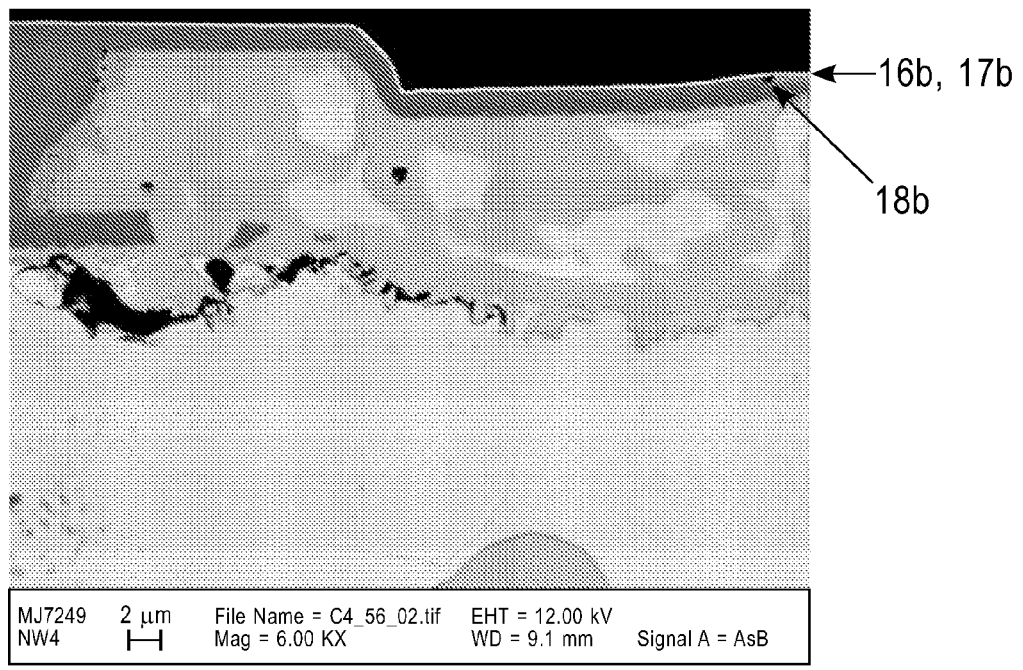
FIG. 4B is a magnified optical view of the interface between the UBM stack and the substrate of the interconnect depicted in FIG. 4A.

FIGS. 4A and 4B depict the optical cross section of an interconnect including a UBM stack including a nickel (Ni) barrier layer 18 in direct contact with a copper (Cu) seed layer 17b that is consistent with the methods and structures provided by the present disclosure. The UBM stack that provided the optical cross sections depicted in FIGS. 4A and 4B included a titanium tungsten (TiW) layer 16b, a Cu seed layer 17b, a first Ni barrier layer 18b, a copper (Cu) conductor layer, a second nickel (Ni) barrier layer and a solder ball after an electromigration test. The optical cross sections depicted in FIGS. 4A and 4B illustrates that the first Ni barrier layer 18b protects the Cu seed layer 17b from being consumed by intermetallics resulting from electromigration.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method of forming an interconnect structure comprising:
    forming a metallic adhesion layer on a contact pad to an electrical component that is present in a substrate;
    forming a copper (Cu) seed layer on the metallic adhesion layer;
    forming a barrier layer in direct contact with the copper (Cu) seed layer, wherein the barrier layer protects the copper (Cu) seed layer from reacting with later formed metallic layers and is selected from the group consisting of titanium (Ti), a Ti-cobalt (Co) alloy, a Ti—Ni alloy, a Ti—Co—Ni alloy and a Ni—Ti alloy;
    forming a copper (Cu) conductor layer on the barrier layer; and
    forming a solder ball atop the copper conductor layer.

2. The method of claim 1, wherein at least one of said forming said metallic adhesion layer and said forming said copper (Cu) seed layer comprises a sputtering process.

3. The method of claim 1, wherein the copper (Cu) seed layer has a thickness ranging from 1500 Å to 5000 Å.

4. The method of claim 1, wherein at least one of forming the barrier layer, and the copper (Cu) conductor layer comprises a plating process.

5. The method of claim 1, wherein the barrier layer has a thickness ranging from 0.5 microns to 2 microns.

6. The method of claim 1, wherein the metallic adhesion layer comprises a titanium tungsten (TiW) alloy layer.

7. An interconnect structure comprising:
    a substrate having an electrical component present therein;
    a under-bump metallurgy (UBM) stack that is present in contact with a contact pad to the electrical component that is present in the substrate, wherein the UBM stack includes a metallic adhesion layer that is in direct contact with the contact pad to the electrical component, a copper (Cu) seed layer that is in direct contact with the metallic adhesion layer, a barrier layer selected from the group consisting of titanium (Ti), a Ti-cobalt (Co) alloy, a Ti—Ni alloy and a Ti—Co—Ni alloy that is present in direct contact with the copper (Cu) seed layer, and a conductor stack including at least one copper containing conductor layer on the barrier layer; and
    a solder ball present on the conductor stack.

8. The interconnect structure of claim 7, wherein the conductor stack comprises a first copper (Cu) conductor layer in direct contact with the barrier layer, a nickel (Ni) barrier layer in direct contact with the first copper (Cu) conductor layer, and a second copper (Cu) conductor layer in direct contact with the nickel (Ni) barrier layer.

9. The interconnect structure of claim 7, wherein the copper (Cu) seed layer is comprised of greater than 97 at. % copper (Cu).

10. The interconnect structure of claim 7, wherein the copper (Cu) seed layer has a thickness ranging from 1500 Å to 5000 Å.

11. The interconnect structure of claim 7, wherein the barrier layer has a thickness ranging from 0.5 microns to 20 microns.

12. The interconnect structure of claim 7, wherein the solder ball has a composition selected from the group consisting of tin, silver and copper and a combination thereof.

13. The interconnect structure of claim 7, wherein the metallic adhesion layer is comprised of a titanium-tungsten (TiW) alloy layer.

14. An interconnect structure comprising:
    a substrate having an electrical component present therein;
    a under-bump metallurgy (UBM) stack that is present in contact with a contact pad to the electrical component that is present in the substrate, wherein the UBM stack includes a metallic adhesion layer that is direct contact with the contact pad to the electrical component, a copper (Cu) seed layer that is in direct contact with the metallic adhesion layer, a nickel (Ni) barrier layer that is alloyed with at least titanium (Ti) and is present in direct contact with the copper (Cu) seed layer; and a solder ball that is in direct contact with the nickel (Ni) barrier layer.

15. The interconnect structure of claim 14, wherein the nickel (Ni) barrier layer further includes cobalt (Co).

16. The interconnect structure of claim 14, wherein the nickel (Ni) barrier layer has a reaction rate that is slower than a reaction rate of copper (Cu).

* * * * *